United States Patent
Choi et al.

(10) Patent No.: US 9,614,121 B1
(45) Date of Patent: Apr. 4, 2017

(54) METHOD OF FABRICATING SEMICONDUCTOR LIGHT EMITTING DEVICE

(71) Applicant: Samsung Electronics Co., Ltd., Suwon-si (KR)

(72) Inventors: Yong Seok Choi, Suwon-si (KR); Chul Min Kim, Gunpo-si (KR); Dong Gyu Shin, Seoul (KR); Ho Chul Lee, Seongnam-si (KR); Joo Young Cheon, Suwon-si (KR); Do Young Rhee, Seoul (KR); Jeong Wook Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/238,047

(22) Filed: Aug. 16, 2016

(30) Foreign Application Priority Data

Jan. 27, 2016 (KR) .................. 10-2016-0010150

(51) Int. Cl.
| | |
|---|---|
| *H01L 21/00* | (2006.01) |
| *H01L 33/00* | (2010.01) |
| *H01L 33/06* | (2010.01) |
| *H01L 33/32* | (2010.01) |

(52) U.S. Cl.
CPC ...... *H01L 33/0075* (2013.01); *H01L 33/0025* (2013.01); *H01L 33/06* (2013.01); *H01L 33/32* (2013.01)

(58) Field of Classification Search
CPC .................. H01L 33/0075; H01L 33/0025
See application file for complete search history.

(56) References Cited

U.S. PATENT DOCUMENTS

| | | | |
|---|---|---|---|
| 6,060,335 A | * | 5/2000 | Rennie .................. B82Y 20/00 148/DIG. 95 |
| 6,372,608 B1 | | 4/2002 | Shimoda et al. |
| 6,645,830 B2 | | 11/2003 | Shimoda et al. |
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |
| 6,967,353 B2 | | 11/2005 | Suzuki et al. |
| 7,002,182 B2 | | 2/2006 | Okuyama et al. |
| 7,084,420 B2 | | 8/2006 | Kim et al. |
| 7,087,932 B2 | | 8/2006 | Okuyama et al. |
| 7,154,124 B2 | | 12/2006 | Han et al. |
| 7,208,725 B2 | | 4/2007 | Sherrer et al. |
| 7,288,758 B2 | | 10/2007 | Sherrer et al. |
| 7,319,044 B2 | | 1/2008 | Han et al. |

(Continued)

FOREIGN PATENT DOCUMENTS

| | | |
|---|---|---|
| JP | 2003289156 | 10/2003 |
| JP | 2004186466 | 7/2004 |

(Continued)

*Primary Examiner* — Bradley K Smith
(74) *Attorney, Agent, or Firm* — Onello & Mello, LLP

(57) ABSTRACT

A method of fabricating a semiconductor light-emitting device is provided that includes forming a first conductivity-type semiconductor layer, forming an active layer by alternately forming a plurality of quantum well layers grown at a first temperature and a plurality of quantum barrier layers grown at a second temperature higher than the first temperature, and forming a second conductivity-type semiconductor layer.

20 Claims, 8 Drawing Sheets

(56) References Cited

U.S. PATENT DOCUMENTS

| | | |
|---|---|---|
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,728,237 B2 | 5/2014 | Shioda et al. |
| 8,735,931 B2 | 5/2014 | Han et al. |
| 8,766,295 B2 | 7/2014 | Kim |
| 2008/0273566 A1 | 11/2008 | Nishinaka et al. |
| 2012/0205616 A1* | 8/2012 | Zhang ............... H01L 21/02458 257/13 |
| 2014/0045289 A1* | 2/2014 | Nago ................. H01L 33/0075 438/47 |

FOREIGN PATENT DOCUMENTS

| | | |
|---|---|---|
| JP | 3987985 | 7/2007 |
| JP | 2008028121 | 2/2008 |
| JP | 2009231591 | 10/2009 |
| JP | 4724901 | 7/2011 |
| JP | 5758037 | 1/2014 |
| JP | 2014187272 | 10/2014 |
| JP | 2015115343 | 6/2015 |

* cited by examiner

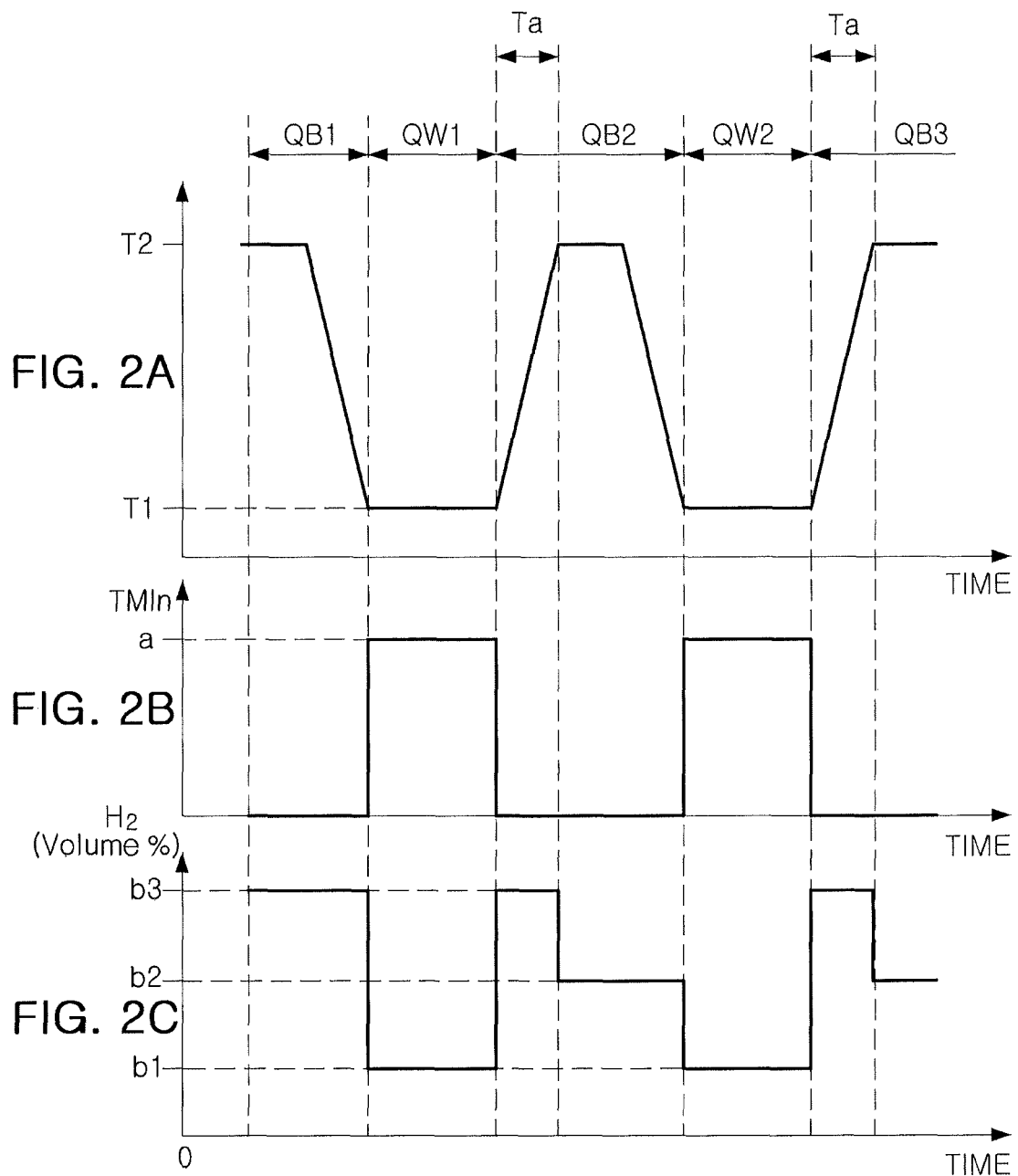

METHOD OF FABRICATING SEMICONDUCTOR LIGHT EMITTING DEVICE

CROSS-REFERENCE TO RELATED APPLICATION

This application claims benefit of Korean Patent Application No. 10-2016-0010150, filed on Jan. 27, 2016, with the Korean Intellectual Property Office, the disclosure of which is incorporated herein by reference in its entirety.

BACKGROUND

The present inventive concept relates to a method of fabricating a semiconductor light emitting device.

A semiconductor light emitting device is a semiconductor device generating light within a specific wavelength band due through a recombination of electrons and holes. Since the semiconductor light emitting device has a number of inherent advantages such as a relatively long service life, low power consumption, excellent initial driving characteristics, and the like, in comparison with a filament-based light source, demand therefor has continuously increased. In particular, a group-III nitride semiconductor material with bluish light in a short-wavelength region may be formed, and this type of material has become important in this field.

When a semiconductor light emitting device is fabricated comprising alternating quantum barrier layers and quantum well layers, a quantum barrier layer comprising part of an active layer may be grown at a relatively high temperature because of considerations related to crystallinity. On the other hand, relatively low-temperature growth of a quantum well layer is generally required. Thus, a quantum well layer grown before a quantum barrier layer may be thermally damaged when the quantum barrier layer is grown thereon at a relatively high temperature. In particular, in a case in which a quantum well layer includes a highly volatile element such as indium, in a subsequent relatively high temperature growth process of forming a quantum barrier layer, indium may be agglomerated at an interface between the quantum barrier layer and a previously-formed quantum well layer by volatilization of the indium, thereby acting as a material/device defect. Thus, when a quantum barrier layer is formed thereon, luminous efficiency of a semiconductor light emitting device may be significantly decreased compared with the performance of a comparable device that does not have the agglomeration defect.

SUMMARY

An aspect of the present inventive concept may provide a method of fabricating a semiconductor light emitting device in which light extraction efficiency of the semiconductor light emitting device is improved by improving crystallinity of a quantum barrier layer forming a portion of the device.

According to an aspect of the present inventive concept, a method of fabricating a semiconductor light emitting device may include the steps of: forming a first conductivity-type semiconductor layer; forming an active layer by alternately forming a plurality of quantum well layers grown at a first temperature and a plurality of quantum barrier layers grown at a second temperature higher than the first temperature on the first conductivity-type semiconductor layer; and forming a second conductivity-type semiconductor layer on the active layer. The plurality of quantum barrier layers may include a portion grown in a rising-temperature fabrication section in which a temperature is increased from a first temperature to a second temperature that is higher than the first temperature. The plurality of quantum barrier layers may be grown in a mixed gas atmosphere including hydrogen gas, and a partial pressure of the hydrogen gas may be controlled to provide a first partial pressure having a constant level in the rising-temperature section, and is adjusted to have a second partial pressure having a constant level, wherein the second partial pressure is lower than the first partial pressure, at the second, higher temperature.

In an aspect, the method of fabricating a semiconductor light-emitting device comprises the steps of: forming a first conductivity-type semiconductor layer; forming an active layer on the first conductivity-type semiconductor layer by alternately forming a plurality of quantum well layers grown at a first temperature and a plurality of quantum barrier layers grown at a second temperature higher than the first temperature; and forming a second conductivity-type semiconductor layer on the active layer, wherein the plurality of quantum barrier layers include a portion grown in a rising-temperature section in which a temperature is increased from the first temperature to the second temperature, and also wherein the plurality of quantum barrier layers are grown in a mixed gas atmosphere including hydrogen gas, and a partial pressure of the hydrogen gas is controlled to have a first partial pressure having a constant level in the rising-temperature section and is adjusted to have a second partial pressure having a constant level, lower than the first partial pressure, at the second temperature.

In another aspect, a semiconductor light-emitting device is fabricated by the steps of: forming a first conductivity-type nitride semiconductor layer; forming an active layer on the first conductivity-type nitride semiconductor layer; and forming a second conductivity-type nitride semiconductor layer on the active layer, wherein the active layer has a structure in which a plurality of quantum barrier layers and a plurality of quantum well layers including indium are alternately stacked, the plurality of quantum barrier layers includes at least one quantum barrier layer grown in a rising-temperature section in which a growth temperature is increased, and during the times in which the plurality of quantum barrier layers are grown, an excess amount of hydrogen gas is supplied, and a first partial pressure of the hydrogen gas in the rising-temperature quantum barrier layer growth section is higher than a second partial pressure thereof in a remaining quantum barrier layer growth section.

In another aspect, a method of fabricating a semiconductor light-emitting device comprises the sequential steps of: (a) forming a first conductivity-type semiconductor on a substrate or on a buffer layer disposed on a substrate; (b) forming an active layer on the first conductivity-type semiconductor, wherein the active layer sequentially comprises: (i) a first quantum barrier layer in contact with the first conductivity-type semiconductor that includes a portion formed at an initial quantum barrier layer growth temperature T2 in an atmosphere that includes an excess amount of hydrogen gas at a substantially constant partial pressure b3; (ii) at least a first quantum well layer formed on the first quantum barrier layer at a substantially constant quantum well layer growth temperature T1, that is 50° C. to 300° C. less than T2, and in an atmosphere that includes hydrogen gas at a substantially constant partial pressure b1, that is lower than b3; and (iii) at least a second quantum barrier layer formed on the first quantum well layer, wherein the second quantum barrier layer is at least partially formed during a rising-temperature growth period during which the temperature increases from T1 to T2 and the atmosphere includes hydrogen gas at the substantially constant partial pressure b3; and, (c) forming a second conductivity-type semiconductor layer on the active layer.

BRIEF DESCRIPTION OF DRAWINGS

The above and other aspects, features and other advantages of the present disclosure will be more clearly understood from the following detailed description taken in conjunction with the accompanying drawings, in which:

FIG. 2A is a graph of growth temperature over time illustrating a growth process for forming alternating layers that comprise a portion of a semiconductor light emitting device in an exemplary embodiment of the present inventive concept;

FIG. 2B is a graph of the flow rate of a main source gas over time illustrating a growth process for forming alternating layers that comprise a portion of a semiconductor light emitting device in an exemplary embodiment of the present inventive concept;

FIG. 2C is a graph of the flow rate of hydrogen gas over time illustrating a growth process for forming alternating layers that comprise a portion of a semiconductor light emitting device in an exemplary embodiment of the present inventive concept;

DETAILED DESCRIPTION

Figure 1:
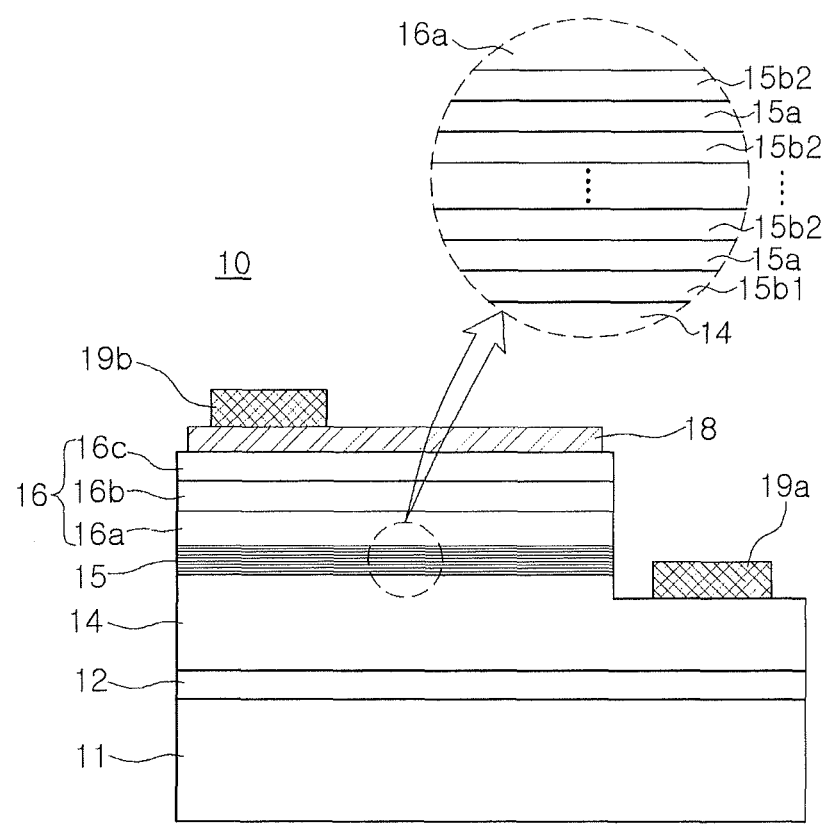
FIG. 1 is a schematic side cross-sectional view illustrating a semiconductor light emitting device according to an exemplary embodiment of the present inventive concept.

FIG. 1 is a side cross-sectional view illustrating a semiconductor light emitting device according to an exemplary embodiment of the present inventive concept. An enlarged portion of the structure of FIG. 1 is illustrated in the "blow-up" circle of the figure.

As illustrated in FIG. 1, a semiconductor light emitting device 10 according to an exemplary embodiment may include a substrate 11, a first conductivity-type semiconductor layer 14, an active layer 15, and a second conductivity-type semiconductor layer 16. In addition, the first conductivity-type semiconductor layer 14, the active layer 15, and the second conductivity-type semiconductor layer 16 are shown sequentially disposed on the substrate 11.

For the substrate 11, a substrate for semiconductor growth formed of a material such as sapphire, SiC, $MgAl_2O_4$, MgO, $LiAlO_2$, $LiGaO_2$, GaN, or the like may be used. In this case, sapphire is a crystal having Hexa-Rhombo R3c symmetry, as is known in this art. The lattice constants of such a sapphire crystal in the directions of a c-axis and an a-axis are 13.001 Å and 4.758 Å, respectively. In addition, sapphire may have a C plane (0001), an A plane (11-20), an R plane (1-102), and the like. In this case, the C plane allows a nitride thin film to be relatively easily grown thereon; and, the C plane is stable at a relatively high temperature, thereby being mainly used as a substrate for nitride growth.

The substrate 11 may have surfaces opposing each other (i.e., on opposite sides of the substrate), and an uneven structure may be formed in at least one of the surfaces opposing each other. The uneven structure may be provided by etching a portion of the substrate 11. Alternatively, the uneven structure may also be provided by forming a heterogeneous material layer different from a material of the substrate 11 on the substrate.

A buffer layer 12 may be disposed between the substrate 11 and the first conductivity-type semiconductor layer 14. The buffer layer 12 may be a layer of $In_xAl_yGa_{1-x-y}N$ (0≤x≤1, 0≤y≤1). For example, the buffer layer 12 may be a layer of aluminum nitride (AlN), aluminum gallium nitride (AlGaN), or indium gallium nitride (InGaN). As required for a particular product, the buffer layer 12 may be formed by combining a plurality of discrete layers, or by gradually changing a composition thereof.

The first conductivity-type semiconductor layer 14 may be a nitride semiconductor layer satisfying the general n-type chemical formula $In_xAl_yGa_{1-x-y}N$ (0≤x<1, 0≤y<1, 0≤x+y<1), and including an n-type impurity, which may be silicon (Si). For example, the first conductivity-type semiconductor layer 14 may include n-type GaN. The second conductivity-type semiconductor layer 16 may be a nitride semiconductor layer satisfying the general p-type chemical formula $In_xAl_yGa_{1-x-y}N$ (0≤x<1, 0≤y<1, 0≤x+y<1), and including a p-type impurity, which may be magnesium (Mg). For example, the second conductivity-type semiconductor layer 16 may be implemented as a single layer structure, but it may also have a multilayer structure comprised of layers having different compositions as required. As illustrated in FIG. 1, the second conductivity-type semiconductor layer 16 may include a p-type AlGaN layer 16a provided as an electron blocking layer (EBL), a low concentration p-type GaN layer 16b, and a high concentration p-type GaN layer 16c.

The active layer 15 may have a multiple quantum well (MQW) structure in which quantum well layers 15a and quantum barrier layers 15b1 and 15b2 (as seen in the "blow-up" circle) are alternately stacked on each other. For example, the quantum well layer 15a and the quantum barrier layers 15b1 and 15b2 may be $In_xAl_yGa_{1-x-y}N$ (0≤x≤1, 0≤y≤1, 0≤x+y≤1) layers having different compositions. The quantum well layer 15a may include a relatively highly volatile element such as indium (In). In a specific example, the quantum well layer 15a may be an $In_xGa_{1-x}N$ (0<x≤1) layer, and the quantum barrier layers 15b1 and 15b2 may be gallium nitride (GaN) or aluminum gallium nitride (AlGaN) layers.

The quantum barrier layers 15b1 and 15b2 employed in the exemplary embodiment may be separately identified as a first quantum barrier layer 15b1 and a second quantum barrier layer 15b2, according to a placement position in the active layer 15. The first quantum barrier layer 15b1 refers to a quantum barrier layer disposed to be in contact with the first conductivity-type semiconductor layer 14, and the second quantum barrier layers 15b2 refer to each of the quantum barrier layers except for the first quantum barrier layer 15b1. The second quantum barrier layer 15b2 is illustrated as comprising a plurality of such layers, but the inventive concept is not limited thereto. For example, the second quantum barrier layer 15b2 may be configured as one layer.

With reference to FIGS. 2A to 2C, a growth process of forming the active layer 15 employed in the exemplary embodiment is described. FIGS. 2A, 2B, and 2C are diagrams, respectively, of variations in a growth temperature, a supply of a main source gas, and a supply of hydrogen gas over time, illustrating a growth process of forming the active layer 15 employable in an exemplary embodiment of the present inventive concept.

FIG. 2A is a graphical representation of the growth process for forming the alternating quantum barrier layers and quantum well layers showing process temperature conditions in the growth environment as a function of time. With reference to FIG. 2A, a growth process of the active layer 15 may be performed in a manner in which the growth environment sections QB1, QB2, and QB3 (in which quantum barrier layers 15b1 and 15b2 are grown) alternate with growth environment sections QW1 and QW2 (in which a quantum well layer 15a is grown). Here, growth environment section QB1 may be a section in which the first quantum barrier layer 15b1, which is in contact with a first conductivity-type semiconductor layer, is grown. The growth environment sections QB2 and QB3 may be sections in which the second quantum barrier layer or layers 15b2 is/are grown.

The quantum barrier layers 15b1 and 15b2 may be grown in a relatively high-temperature growth section such as at a second temperature T2, while the quantum well layer of layers 15a may be grown at a first temperature T1 that is lower than the second temperature T2. In this case, a temperature difference between the first temperature T1 and the second temperature T2 may be 50° C. to 300° C.

The growth sections QB2 and QB3 in which the second quantum barrier layer or layers 15b2 is/are formed after the quantum well layer 15a is formed, may include a rising-temperature growth section Ta in which a temperature is increased from the first temperature T1 to the second temperature T2, and a falling-temperature growth section in which a temperature is decreased from the second temperature T2 to the first temperature T1. Thus, the rising-temperature growth section Ta may only appear in the growth sections QB2 and QB3 in which the second quantum barrier layers 15b2 are grown.

FIG. 2B is a graphical representation of the growth process for forming the alternating quantum barrier layers and quantum well layers showing the supply of an indium (In) source gas to the growth environment as a function of time. With reference to FIG. 2B, TMIn, an indium (In) source gas, is not supplied to the growth sections QB1, QB2, and QB3, the growth periods in which the quantum barrier layers 15b1 (in QB1) and 15b2 (in QB2 and QB3) are grown, and a predetermined flow rate (a) of the In source gas may only be supplied to the growth sections QW1 and QW2, the growth periods in which the quantum well layers 15a are grown.

In a growth process of forming the first and second quantum barrier layers 15b1 and 15b2, a fixed amount of a nitrogen source gas, such as NH$_3$, and a gallium source gas, such as trimethyl gallium (TMGa), are supplied, thereby forming a GaN thin film. In a growth process of forming the quantum well layer 15a, an amount of supplied TMGa, a gallium source, may be decreased as compared with the process conditions under which the first and second quantum barrier layers 15b1 and 15b2 are formed, and a fixed amount of TMIn, an indium source, may be additionally supplied, thereby forming a required InGaN thin film.

FIG. 2C is graphical representation of the growth process for forming the alternating quantum barrier layers and quantum well layers showing the supply of hydrogen (H2) to the growth environment as a function of time. With reference to FIG. 2C, a mixed gas including hydrogen gas at a first partial pressure b3 may be supplied only to the growth section QB1 (in which the first quantum barrier layer 15b1 is grown) and to growth sections QB2 and QB3 (in which the second quantum barrier layers 15b2 are grown). The first partial pressure b3 may be maintained constantly at a predetermined partial pressure, and the first partial pressure b3 refers to a value input from a control device supplying hydrogen gas, but a partial pressure value measured during an actual reaction may include small unintentional variations in some portions of the growth sections (for example, a start section or an end section).

The hydrogen gas described above may improve crystallinity of the second quantum barrier layers 15b2, thereby improving rating properties and light output of a semiconductor light emitting device. However, the quantum barrier layers 15b2 are grown at a relatively high growth temperature, thereby creating the possibility of thermally damaging the quantum well layer 15a including an indium component of layer 15a because the indium component has a relatively high volatility. For example, in the case of forming a quantum barrier layer at a relatively high growth temperature, indium incorporated into a previously formed quantum well layer may become agglomerated, which then becomes a point defect of the quantum well layer. As a result, crystallinity of a quantum barrier layer formed on the affected quantum well layer may be decreased. The point defect in the affected quantum well layer may allow a leakage current to occur inside an active layer, thereby causing problems of decreased rating properties and decreased light output of a semiconductor light emitting device fabricated from such a defective structure. As described above, in order to prevent crystallinity of the quantum barrier layer from being decreased by a point defect on a surface of a previously formed quantum well layer, an excess amount of hydrogen gas may be supplied during the quantum barrier layer 15b1 growth process, thereby removing indium that may have been vaporized and then agglomerated on the quantum well layer 15a. However, in such a case, the excess supplied hydrogen gas may remove indium that became volatilized and agglomerated on the quantum well layer, but in the course of doing so, the excess hydrogen may damage a grown quantum barrier layer. As used herein, the term "an excess amount of hydrogen gas" is defined as a sufficient concentration of hydrogen gas in the gas atmosphere being supplied to the growth chamber in which a quantum barrier layer is being formed in order to remove all or substantially all of the indium or indium compounds that may have agglomerated on a previously formed quantum well layer. Such "an excess amount of hydrogen gas" may typically range from 2.5 vol % to 20.0 vol % of ambient gas supplied to the chamber. Thus, the desired effect of improving crystallinity of the quantum barrier layer may not be realized by simply supplying excess hydrogen gas during a quantum barrier layer growth step.

In consideration of the above described problem, in the rising-temperature sections Ta of the growth sections QB2 and QB3 (in which the second quantum barrier layers 15b2 are formed after the quantum well layer 15a has been formed), an excess amount of hydrogen gas is initially supplied corresponding to the first partial pressure b3. But, in growth sections QB2 and Q3, the amount of hydrogen gas supplied is reduced after a short initial time period to a reduced amount corresponding to a second, lower partial pressure b2. In this way, the quantum barrier layer may be prevented from being damaged by an excessive amount of hydrogen gas while agglomerated indium is still effectively removed. The hydrogen gas at the first partial pressure b3 may be supplied to have a volume of 2.5 vol % to 20.0 vol % of ambient gas supplied to a growth chamber; and, the hydrogen gas at the second partial pressure b2 may be supplied to have a volume of 1.4 vol % to 20.0 vol % of ambient gas, and provided that b2 is always less then b3. In this case, the second partial pressure b2 may be lower than the first partial pressure b3 by 1.1 vol % to 18.6 vol %.

As discussed above, if an excessive amount of hydrogen gas, for example an amount corresponding to the first partial pressure b3 of hydrogen gas, is continuously supplied to the growth environment, a quantum barrier layer may be damaged, thereby causing the occurrence of a problem because a defect occurs in the quantum barrier layer and/or an operating voltage is increased.

In the rising-temperature section Ta of the subsequent growth sections in which additional second quantum barrier layers 15b2 are grown (after each additional quantum well layer 15a has been grown in hydrogen gas at a third partial pressure b1, which is lower than b2 or b3), an amount of supplied hydrogen gas is again initially increased to an amount corresponding to the first partial pressure b3 to effectively remove indium that may have been vaporized and then agglomerated on each additional quantum well layer 15a. In addition, in a subsequent growth section in which a growth temperature of the additional second quantum barrier layers 15b2 is maintained or decreased, the amount of the supplied hydrogen gas is again reduced to an amount corresponding to the second partial pressure b2, thereby preventing the additional second quantum barrier layers 15b2 from being damaged. Thus, light efficiency may be improved by significantly reducing defects in the quantum barrier layers or damage of the quantum barrier layers.

The first temperature T1 at which the quantum well layer 15a is grown may be changed according to a required indium composition ratio. In other words, as an indium composition ratio is increased, the quantum well layer 15a may be grown at a relatively low temperature. For example, the first temperature T1 may be 900° C. or less, and in some embodiments, it may be 850° C. or less. A growth temperature of the first and second quantum barrier layers 15b1 and 15b2 may be higher than a growth temperature of the quantum well layer 15a under conditions in which possible thermal damage to the quantum well layer 15a is significantly reduced.

The second temperature T2 may be adopted under a condition of securing excellent crystallinity of the second quantum barrier layers 15b2. Although the inventive concept is not limited thereto, a difference between the first temperature T1 and the second temperature T2 may be at least 50° C. to 300° C. If a temperature difference of 300° C. or more occurs, the possibility of warpage of a wafer may be increased. If a temperature difference is less than 50° C. between the first temperature T1 and the second temperature T2, it may be difficult to expect a growth temperature control effect. A temperature of the rising-temperature section Ta may be increased at a constant rate, and such a temperature may be maintained for a period of 10 seconds to 600 seconds.

Figure 3A:
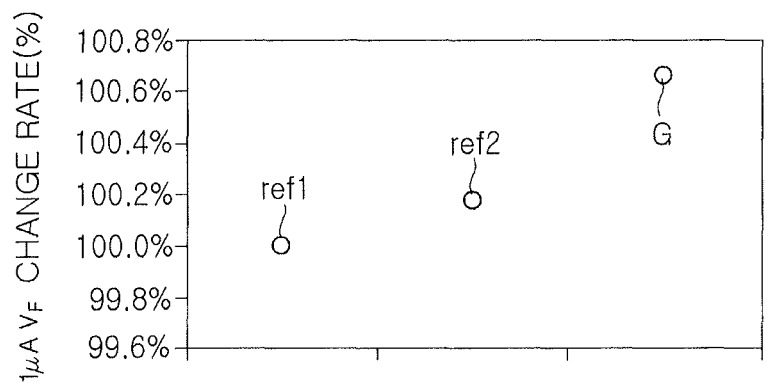
FIG. 3A is a graph comparing rated voltage change rates of a semiconductor light emitting device according to an exemplary embodiment of the present inventive concept and rated voltage change rates for a comparative device.
Figure 3B:
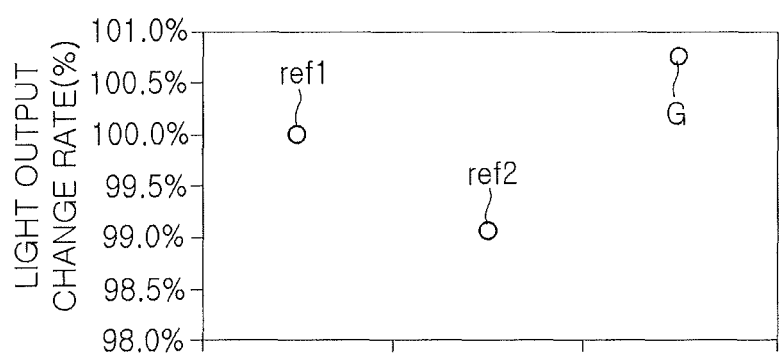
FIG. 3B is a graph comparing light output of a semiconductor light emitting device according to an exemplary embodiment of the present inventive concept and light output for a comparative device.

With reference to FIGS. 3A and 3B, an effect of a semiconductor light emitting device according to an exemplary embodiment will be described. FIG. 3A is a graph comparing rated voltage change rates (Vf) of a semiconductor light emitting device according to an exemplary embodiment and also according to a comparative example. FIG. 3B is a graph comparing light output of a semiconductor light emitting device according to an exemplary embodiment and also according to a comparative example.

In FIGS. 3A and 3B, the reference character "ref1" identifies a comparative example that illustrates device performance characteristics when hydrogen gas is not injected in a growth section in which a second quantum barrier layer is being grown. Reference character "ref2" denotes device performance characteristics when a constant and excess amount of hydrogen gas is continuously injected in a growth section in which a second quantum barrier layer is grown. By comparison, reference character G indicates the device performance characteristics for the exemplary embodiment in accordance with the inventive concepts of this application. As illustrated in FIG. 3A, in respective cases, Vf is measured at the time at which a current of 1 μA is applied to a semiconductor light emitting device. As seen in FIG. 3A, ref2 is 100.2% of ref1, while the exemplary embodiment G is 100.7% of ref1, which means that respective Vf values are improved. As seen in FIG. 3B, light output of ref2 is only 99% of light output of ref1, which means that the light output of ref2 is decreased relative to the light output of ref1. On the other hand, light output of the exemplary embodiment G is 100.6% of light output of ref1. Thus, both Vf and light output of the exemplary embodiment may be improved in comparison with Vf and light output of ref1 and ref2.

As illustrated in FIG. 1, the semiconductor light emitting device 10 may include a first electrode 19a disposed on the first conductivity-type semiconductor layer 14, and an ohmic contact layer 18 and a second electrode 19b sequentially disposed on the second conductivity-type semiconductor layer 16.

Although the inventive concepts are not limited thereto, in some embodiments the first electrode 19a and the ohmic contact layer 18 may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, and may be provided in a structure having a single layer or two or more layers. The first electrode 19a may include Cr/Au as a contact electrode layer. The first electrode 19a may further include a pad electrode layer on the contact electrode layer. The pad electrode layer may be a gold (Au), tin (Sn), or Au/Sn layer.

The ohmic contact layer 18 may be variously implemented according to a chip structure. For example, in the case of a flip-chip structure, the ohmic contact layer 18 may include Ag. In a case of a structure reversely disposed, the ohmic contact layer 18 may be configured of a light transmitting electrode. The light transmitting electrode may be formed of one of a transparent conductive oxide layer or a nitride layer. For example, the light transmitting electrode may be at least one member selected from a group consisting of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and zinc magnesium oxide ($Zn_{(1-x)}Mg_xO$, $0 \leq x \leq 1$). As required, the ohmic contact layer 18 may include graphene. The second electrode 19b may include Au, Sn, or Au/Sn.

Next, with reference to FIGS. 4 to 8, a process of fabricating a semiconductor light emitting device according to an exemplary embodiment is described. FIGS. 4 to 8 are schematic side cross-sectional views of a device structure illustrating the main steps or operations in a process of fabricating a semiconductor light emitting device 10 as shown in FIG. 1.

Figure 4:
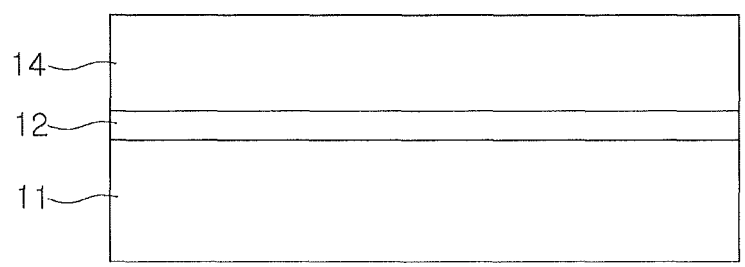
FIGS. 4 to 8 are schematic side cross-sectional views of a device structure illustrating the main steps or operations in a process of fabricating a semiconductor light emitting device as shown in FIG. 1.

With reference to FIG. 4, a buffer layer 12 and a first conductivity-type semiconductor layer 14 may be sequentially formed on a substrate 11. As described previously, the substrate 11 may be an insulating substrate such as sapphire, or may be a conductive substrate or a semiconductor substrate. For example, the substrate 11 may be formed using SiC, Si, $MgAl_2O_4$, MgO, $LiAlO_2$, $LiGaO_2$, or GaN as well as sapphire.

The buffer layer 12 may be a layer that functions to correct a lattice mismatch between the substrate 11 and the first conductivity-type semiconductor layer 14. For example, an AlN layer may be used as buffer layer 12 in the exemplary embodiment. The first conductivity-type semiconductor layer 14 may be an n-type nitride semiconductor layer, such as $In_xAlyGa_{1-x-y}N$ (0≤x<1, 0≤y<1, 0≤x+y<1), and an n-type impurity may be Si. For example, the first conductivity-type semiconductor layer 14 may include n-type GaN.

Next, an active layer 15 that comprises a plurality of quantum barrier layers and a plurality of quantum well layers may be formed on the first conductivity-type semiconductor layer 14. Operations for forming the active layer 15 will be described with reference to FIGS. 5 to 7.

Figure 5:
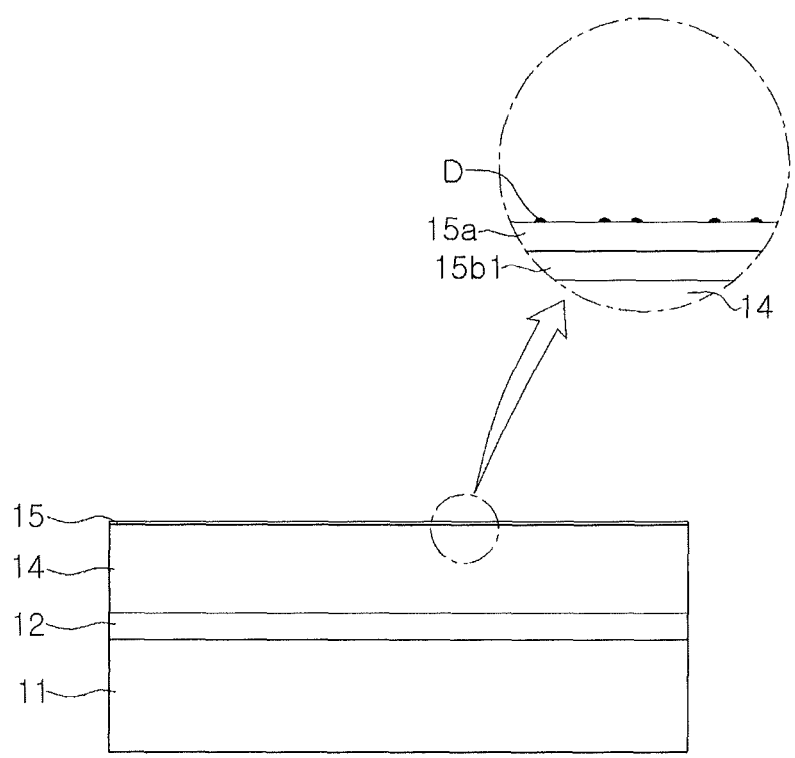

First, as illustrated in FIG. 5, a first quantum barrier layer 15b1 may be formed on the first conductivity-type semiconductor layer 14. The first quantum barrier layer 15b1 may be grown by supplying a source gas and ambient gas to a growth chamber containing the structure of FIG. 4 while maintaining a temperature range of 700° C. to 1300° C.

With reference to FIGS. 2A to 2C, described previously, the ambient gas may include an excess amount of hydrogen gas at the first partial pressure b3. The hydrogen gas at the first partial pressure b3 may be supplied to have a volume of 2.5 vol % to 20.0 vol % relative to the amount of ambient gas supplied to the chamber.

Next, a quantum well layer 15a may be grown on the first quantum barrier layer 15b1. The quantum well layer 15a may be grown by supplying a source gas and ambient gas to the chamber while maintaining a temperature range of 900° C. or less, in some embodiments, a temperature of 850° C. or less.

With reference to FIGS. 2A to 2C, described previously, for the step of growing quantum well layer 15a, an amount of supplied hydrogen gas included in the ambient gas may be reduced to an amount corresponding to the third partial pressure b1. The first temperature T1 may be employed in the exemplary embodiment under conditions in which thermal damage to the quantum well layer 15a is significantly reduced.

Next, a second quantum barrier layer may be formed on the quantum well layer 15a. Reference character D in FIG. 5 illustrates vaporized indium (In) that may have become agglomerated on a quantum well layer 15a in a rising-temperature section in which the second quantum barrier layer is heated to grow the second quantum barrier layer.

Figure 6:
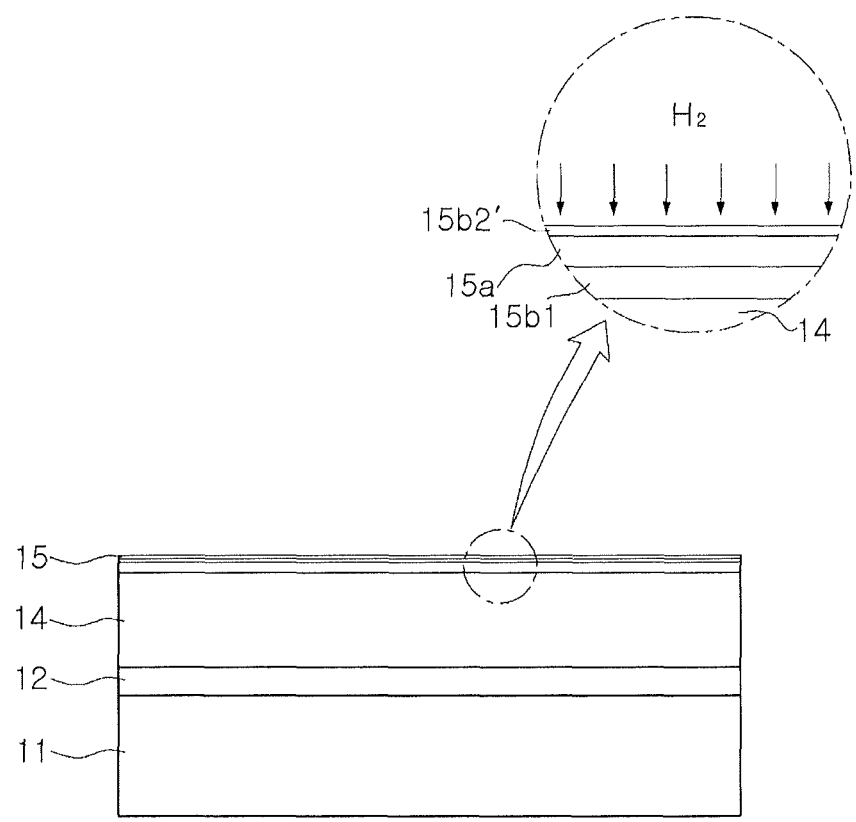

FIG. 6 illustrates that the agglomerated indium D in FIG. 5 is removed, while a second quantum barrier layer 15b2 comprising at least the initial second quantum barrier layer 15b2' is grown, due to hydrogen gas being supplied in an excess amount when the initial second quantum barrier layer 15b2' is grown. The hydrogen gas supplied in an excess amount during this process step allows indium D that may have been vaporized and agglomerated on the quantum well layer 15a to be removed, thereby improving crystallinity of the initial second quantum barrier layer 15b2'.

Figure 7:
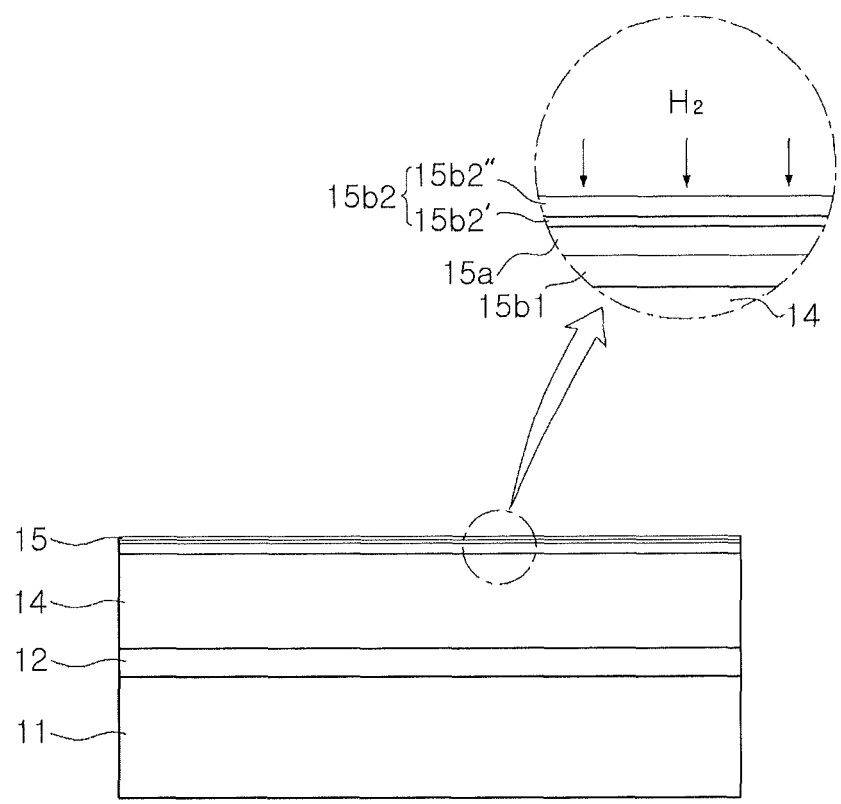

FIG. 7 illustrates that an additional second quantum barrier layer 15b2" can be grown (to form a compound or multilayer second quantum barrier layer 15b2 comprising quantum barrier layers 15b2' and 15b2") in a process in which a second temperature is maintained after a rising-temperature section. In this case, if an amount of supplied hydrogen gas was maintained at an excess amount corresponding to a first partial pressure b3, a surface of the additional second quantum barrier layer 15b2" may be damaged thereby. Thus, during this growth step, the amount of the supplied hydrogen gas may be reduced to an amount corresponding to the second partial pressure b2, thereby growing the additional second quantum barrier layer 15b2" without surface damage. By repeatedly performing the above processes, an active layer in which quantum barrier layers and quantum well layers are repeatedly stacked thereon may be formed.

Figure 8:
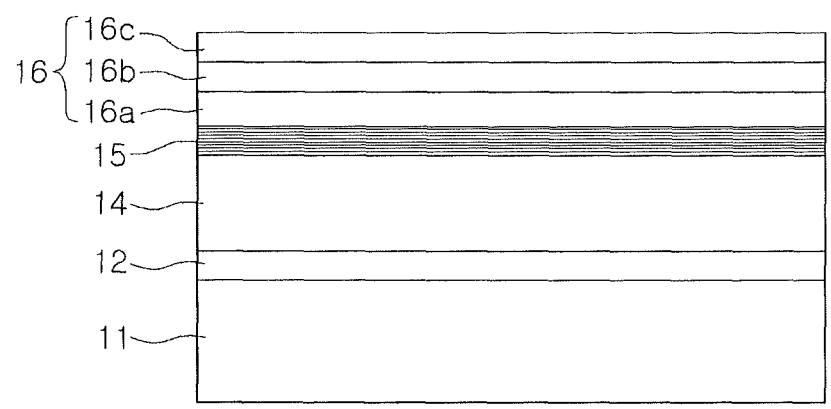

Next, as illustrated in FIG. 8, a second conductivity-type semiconductor layer 16 is formed on the active layer 15. Portions of first and second conductivity-type semiconductor layers 14 and 16 and active layer 15 are then mesa-etched, and the first electrode 19a, the ohmic contact layer 18, and the second electrode 19b are provided, as described above, to form the semiconductor light emitting device shown in FIG. 1.

As set forth above, according to exemplary embodiments of the present inventive concept, a method of fabricating a semiconductor light emitting device is provided in which light extraction efficiency is improved by improving crystallinity of a quantum barrier layer, by controlling a flow rate of hydrogen gas supplied according to a growth temperature when the quantum barrier layer is grown.

While exemplary embodiments have been shown and described above, it will be apparent to those skilled in the art that modifications and variations could be made without departing from the scope of the present inventive concept as defined by the appended claims.

What is claimed is:

1. A method of fabricating a semiconductor light-emitting device comprising the steps of:
   forming a first conductivity-type semiconductor layer;
   forming an active layer on the first conductivity-type semiconductor layer by alternately forming a plurality of quantum well layers grown at a first temperature and a plurality of quantum barrier layers grown at a second temperature higher than the first temperature; and
   forming a second conductivity-type semiconductor layer on the active layer,
   wherein the plurality of quantum barrier layers include a portion grown in a rising-temperature section in which a temperature is increased from the first temperature to the second temperature, and
   also wherein the plurality of quantum barrier layers are grown in a mixed gas atmosphere including hydrogen gas, and a partial pressure of the hydrogen gas is controlled to have a first partial pressure having a constant level in the rising-temperature section and is adjusted to have a second partial pressure having a constant level, lower than the first partial pressure, at the second temperature.

2. The method of claim 1, wherein the first partial pressure of the hydrogen gas is 2.5 vol % to 20.0 vol % of a partial pressure of the mixed gas atmosphere.

3. The method of claim 1, wherein the second partial pressure of the hydrogen gas is 1.4 vol % to 20.0 vol % of a partial pressure of the mixed gas atmosphere.

4. The method of claim 1, wherein the second partial pressure is lower than the first partial pressure by 1.1 vol % to 18.6 vol %.

5. The method of claim 1, wherein a difference between the first temperature and the second temperature is 50° C. to 300° C.

6. The method of claim 1, wherein the rising-temperature section is maintained for 10 seconds to 600 seconds.

7. The method of claim 1, wherein each of the plurality of quantum well layers is formed by supplying an indium source gas at a constant partial pressure at the first temperature.

8. The method of claim 7, wherein the indium source gas is trimethlyindium (TMIn).

9. The method of claim 1, wherein each of the plurality of quantum well layers is grown in a mixed gas atmosphere including the hydrogen gas, and a partial pressure of the hydrogen gas at which each of the plurality of quantum well layers is grown is a third partial pressure, the third partial pressure being lower than the second partial pressure and having a constant level during the quantum well layer growth step.

10. A method of fabricating a semiconductor light-emitting device comprising the steps of:
   forming a first conductivity-type nitride semiconductor layer;
   forming an active layer on the first conductivity-type nitride semiconductor layer; and
   forming a second conductivity-type nitride semiconductor layer on the active layer,
   wherein the active layer has a structure in which a plurality of quantum barrier layers and a plurality of quantum well layers including indium are alternately stacked,
   the plurality of quantum barrier layers includes at least one quantum barrier layer grown in a rising-temperature section in which a growth temperature is increased, and
   during the times in which the plurality of quantum barrier layers are grown, an excess amount of hydrogen gas is supplied, and a first partial pressure of the hydrogen gas in the rising-temperature quantum barrier layer growth section is higher than a second partial pressure thereof in a remaining quantum barrier layer growth section.

11. The method of claim 10, wherein indium agglomerated on a surface of at least one quantum well layer of the plurality of quantum well layers is removed by the hydrogen gas supplied during the rising-temperature section.

12. The method of claim 10, wherein the hydrogen gas is supplied according to a stepped profile in which a partial pressure of the hydrogen gas is decreased from the first partial pressure to the second partial pressure.

13. The method of claim 10, wherein a growth temperature at which a quantum barrier layer is formed is higher than a growth temperature at which a quantum well layer is formed.

14. The method of claim 10, wherein a constant amount of an indium source is supplied during the time in which a quantum well layer is grown.

15. The method of claim 10, wherein each of the plurality of quantum well layers is grown in a mixed gas atmosphere including the hydrogen gas, and a partial pressure of the hydrogen gas at which each of the plurality of quantum well layers is grown is a third partial pressure lower than the second partial pressure and having a constant level during the quantum well layer growth step.

16. A method of fabricating a semiconductor light-emitting device comprising the sequential steps of:
   (a) forming a first conductivity-type semiconductor on a substrate or on a buffer layer disposed on a substrate;
   (b) forming an active layer on the first conductivity-type semiconductor, wherein the active layer sequentially comprises: (i) a first quantum barrier layer in contact with the first conductivity-type semiconductor that includes a portion formed at an initial quantum barrier layer growth temperature T2 in an atmosphere that includes an excess amount of hydrogen gas at a substantially constant partial pressure b3; (ii) at least a first quantum well layer formed on the first quantum barrier layer at a substantially constant quantum well layer growth temperature T1, that is 50° C. to 300° C. less than T2, and in an atmosphere that includes hydrogen gas at a substantially constant partial pressure b1, that is lower than b3; and (iii) at least a second quantum barrier layer formed on the first quantum well layer, wherein the second quantum barrier layer is at least partially formed during a rising-temperature growth period during which the temperature increases from T1 to T2 and the atmosphere includes hydrogen gas at the substantially constant partial pressure b3; and,
   (c) forming a second conductivity-type semiconductor layer on the active layer.

17. The method of claim 16 wherein the first quantum barrier layer further includes a portion that is formed during a falling-temperature growth period during which the temperature drops from T2 to T1.

18. The method of claim 17 wherein the second quantum barrier layer further includes a portion that is formed during a substantially constant temperature growth period at temperature T2, and/or formed during falling-temperature growth period where the temperature drops from T2 to T1, and in an atmosphere that includes hydrogen gas at a substantially constant partial pressure b2, which is greater than b1 and less than b3.

19. The method of claim 18 further wherein a second quantum well layer is formed on the second quantum barrier layer at the substantially constant temperature T1 and in an atmosphere that includes hydrogen gas at the substantially constant partial pressure b1.

20. The method of claim 18 wherein: T1 is 850° C. to 900° C. or less; b3 is 2.5 vol % to 20.0 vol % of the mixed gas atmosphere; and b2 is 1.4 vol % to 20.0 vol % of the mixed gas atmosphere.

* * * * *